(12) United States Patent
Leip

(10) Patent No.: US 7,064,535 B2
(45) Date of Patent: *Jun. 20, 2006

(54) MEASUREMENT CIRCUIT WITH IMPROVED ACCURACY

(75) Inventor: David G. Leip, Newton, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/153,104

(22) Filed: Jun. 15, 2005

(65) Prior Publication Data

US 2005/0231189 A1    Oct. 20, 2005

Related U.S. Application Data

(62) Division of application No. 10/425,329, filed on Apr. 29, 2003, now Pat. No. 6,914,425.

(51) Int. Cl.
*G01R 31/28* (2006.01)
(52) U.S. Cl. .................................. 324/158.1
(58) Field of Classification Search ............. None
See application file for complete search history.

(56) References Cited

U.S. PATENT DOCUMENTS

| | | | |
|---|---|---|---|
| 5,189,362 A | 2/1993 | Doble | |
| 5,424,663 A | 6/1995 | Wong | |
| 5,485,292 A | 1/1996 | Wong et al. | |
| 5,514,972 A | 5/1996 | DeMoor et al. | |
| 5,977,824 A | 11/1999 | Sparks | |
| 6,914,425 B1 * | 7/2005 | Leip | 324/158.1 |

FOREIGN PATENT DOCUMENTS

EP    WO 93/24993 A1    12/1993

OTHER PUBLICATIONS

International Search Report, Mailing Date Nov. 2, 2004.

* cited by examiner

*Primary Examiner*—Jermele Hollington
*Assistant Examiner*—Trung Nguyen

(57) ABSTRACT

A measurement circuit for measuring input voltages in an automatic test system includes a pedestal source, a differential amplifier, and a feedback amplifier. The differential amplifier measures a "residue," i.e., a difference between an input signal and a pedestal signal from the pedestal source, which is programmed to equal an expected input voltage. The feedback amplifier boosts the residue before it is presented to the differential amplifier, and thus allows the differential amplifier to be operated at lower gain than is typically used in conventional topologies. Consequently, the effect of the errors in the differential amplifier are reduced.

16 Claims, 2 Drawing Sheets

MEASUREMENT CIRCUIT WITH IMPROVED ACCURACY

CROSS REFERENCES TO RELATED APPLICATION

This is a divisional application of U.S. application Ser. No. 10/425,329, filed Apr. 29, 2003 U.S. Pat. No. 6,914,425, and entitled "MEASUREMENT CIRCUIT WITH IMPROVED ACCURACY."

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to measurement circuits used in automatic test equipment, and, more particularly, to measurement circuits employing accurate pedestal sources.

2. Description of Related Art

A fundamental requirement of automatic test systems is the ability to measure accurately electronic signals from devices under test. A variety of circuit topologies have been devised for this purpose.

FIG. 1 shows a high-level example of a measurement circuit that employs an accurate pedestal source 112. The pedestal source is generally programmable and is adjusted to produce an accurate voltage $V_{PED}$ approximately equal to an expected differential input voltage HI–LO of the measurement circuit. A summing circuit 114 adds a low side (LO) of the measurement circuit to $V_{PED}$, and a differential amplifier 110 measures the difference between a high side of the measurement circuit (HI) and the output of the summer 114 (LO+$V_{PED}$). The output of the differential amplifier is then customarily converted to a digital signal by an analog-to-digital converter 116.

The measurement circuit reads the value, $G*[(HI-LO)-V_{PED}]$, where G is the gain of the differential amplifier 110. This reading corresponds to the difference, or "residue," between the actual input voltage HI–LO and the programmed expected input voltage, $V_{PED}$. This reading can be converted to a measurement of input voltage, HI–LO, by and adding a numeric value that corresponds to $V_{PED}$ to the reading (and correcting for gain). Thus, for example, if the measurement circuit were to read 2.4 volts with G=100 and $V_{PED}$=1 volt, the actual input voltage implied by these conditions would be 1 volt+2.4 volts/100 =1.024 volts.

The measurement circuit can be made to be very precise because $V_{PED}$ can be precisely characterized and can be very stable. We have recognized, however, that the measurement circuit has errors that may adversely affect its performance. For example, offset voltage errors in the differential amplifier 110 induces errors in the measurement circuit. Because the residue is generally a small voltage, it is desirable to operate the differential amplifier 110 at high gain, to assure that the residue is large enough to be readily measured. As is known, however, offset errors of differential amplifiers grow proportionally larger as gain is increased.

It would be desirable for measurement circuits employing pedestal sources to produce large residue signals without being so adversely affected by errors in the differential amplifier.

BRIEF SUMMARY OF THE INVENTION

With the foregoing background in mind, it is an object of the invention for a measurement circuit employing a pedestal source to have reduced errors.

To achieve the foregoing object, as well as other objectives and advantages, a measurement circuit includes a feedback amplifier and a differential amplifier, each having a first input, a second input, and an output. The first input of the feedback amplifier receives an input signal. The first input of the differential amplifier is coupled to a pedestal source, and the second input of the differential amplifier is coupled to the output of the feedback amplifier. An attenuator is coupled between the first and second inputs of the differential amplifier and provides a feedback signal, which is conveyed to the second input of the feedback circuit.

The operation of the feedback amplifier effectively boosts the residue signal and therefore allows the differential amplifier to be operated at substantially reduced gain, reducing overall circuit errors.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Figure 1:
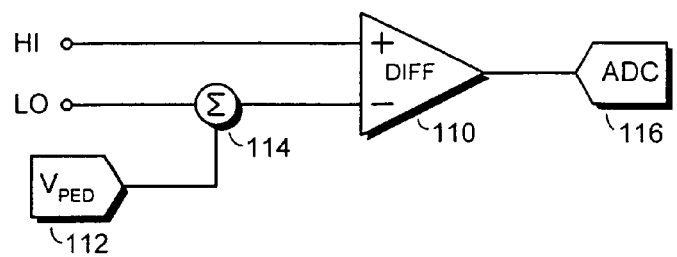
FIG. 1 is block diagram of a measurement circuit employing a pedestal source according to the prior art.
Figure 2:
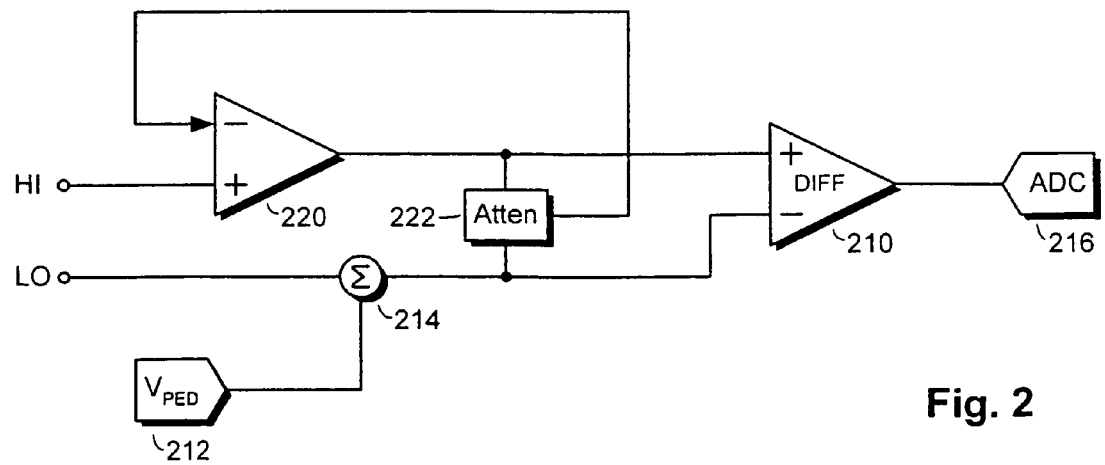
FIG. 2 is a block diagram of an improved measurement circuit employing a pedestal source according to the invention.

FIG. 2 shows an illustrative embodiment of a measurement circuit according to the invention. Certain portions of the measurement circuit of FIG. 2 are similar to those of FIG. 1. For instance, pedestal source 212 is similar to pedestal source 112, summer 214 is similar to summer 114, and ADC 216 is similar to ADC 116. In addition, differential amplifier 210 of FIG. 2 is similar to differential amplifier 110 of FIG. 1, except that it, is preferably operated at substantially lower gain.

The measurement circuit of FIG. 2 also produces a "residue," i.e., a signal indicative of the difference between the input voltage, here HI–LO, and the pedestal voltage, $V_{PED}$. However, the residue produced in FIG. 2 is substantially larger than the residue produced in FIG. 1. In FIG. 1, the differential amplifier 110 handles the entire task of amplifying the residue to provide a large enough signal that can readily be measured by the ADC 116. In FIG. 2, however, the differential amplifier 110 and a feedback circuit share this task. Preferably, the feedback circuit provides most or all of the gain for amplifying the residue, and the differential amplifier provides relatively little gain.

The feedback circuit includes a feedback amplifier 220 and an attenuator 222. The attenuator 222 provides a feedback signal to the feedback amplifier 220. The attenuator 222 has a nominal attenuation of 1/G, which means that the voltage fed back to the feedback amplifier 220 is—

$$V_-+(V_+-V_-)/G,$$

where $V_+$ and $V_-$ are the non-inverting and inverting inputs of the differential amplifier 210, respectively. The HI side of the input voltage is applied to an input of the feedback amplifier 220. Also, the LO side of the input voltage is added to the pedestal voltage and applied to the inverting input of the differential amplifier 210. By closed-loop operation of the feedback amplifier and attenuator, the non-inverting (+) input of the differential amplifier 210 is forced to a level that equals—

$$HI+((HI-(LO+V_{PED}))*(G-1).$$

Assuming that the differential amplifier 210 has a gain of one, the output of the differential amplifier is thus $$\begin{aligned}V_{DIFF} &= V_+ - V_- \\ &= HI + ((HI - LO - V_{PED}))*(G-1) - (LO + V_{PED}) \\ &= G*((HI - LO) - V_{PED}) \\ &= G*(\text{Residue})\end{aligned}$$

This value is exactly the desired quantity, and it is accomplished with the differential amplifier 210 having a gain of only one. After measuring this value, one can compute the actual input voltage, HI–LO, as $V_{PED}+V_{DIFF}/G$.

All other things being equal, the errors in the circuit of FIG. 2 are much lower than those in the circuit of FIG. 1. Because the output of the differential amplifier $V_{DIFF}$ is divided by G to compute the input voltage, the effect of the differential amplifier's offset voltage on overall circuit performance is negligible. The feedback amplifier 220 adds some offset error, but it can be made negligible by selecting a low offset operational amplifier for the feedback amplifier or by trimming the offset of the feedback amplifier to near zero.

The measurement circuit of FIG. 2 thus effectively transfers the source of offset error from the differential amplifier 210 to the feedback amplifier 220. This may not appear at first to be a substantial improvement. However, many low offset op amps are commercially available, whereas most differential amplifiers have relatively large offset error. Thus, the measurement circuit of FIG. 2 allows better accuracy to be achieved with readily available, commercial components.

We have also found that the measurement circuit of FIG. 2 has lower common mode errors than the topology of FIG. 1. Although common mode errors of differential amplifiers tend to improve with gain, they do not improve as much as they do in the circuit of FIG. 2. For example, the common mode rejection ratio (CMRR) of a conventional differential amplifier operating at a gain of 1000 is are approximately 35 dB less than the CMRR of the measurement circuit of FIG. 2 operating at the same gain.

Figure 3:
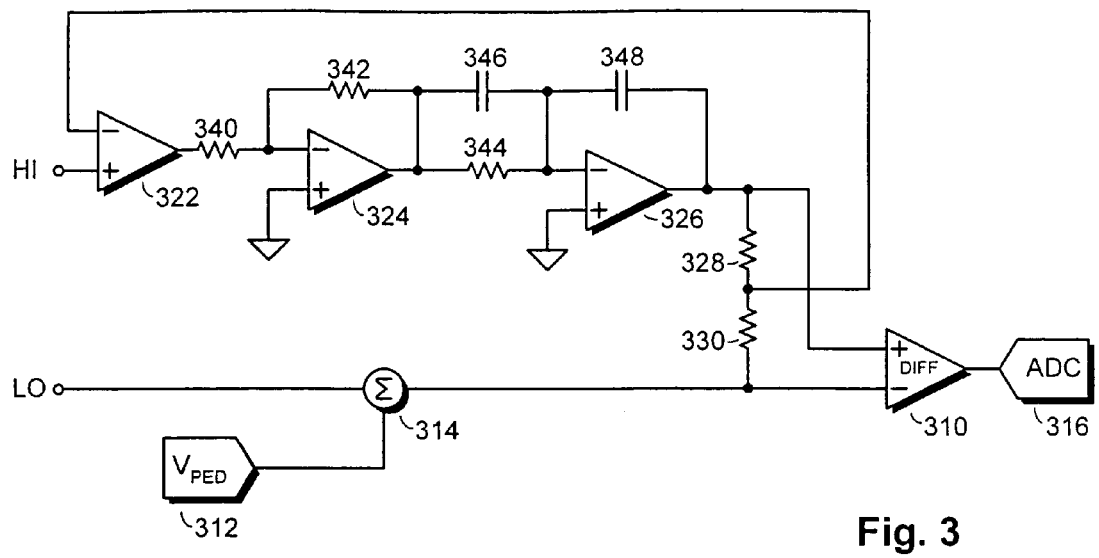
FIG. 3 is a simplified schematic of the measurement circuit of FIG. 2.

FIG. 3 shows a more detailed embodiment of the measurement circuit of FIG. 2. In this exemplary embodiment, the feedback amplifier is seen to include three different stages: an input stage 322, and inverter stage 324, and an integrator stage 326. Each of these three stages is preferably implemented with a separate operational amplifier (op amp).

The op amp used for the input stage 322 preferably has a low offset voltage and a high inherent common mode rejection ratio. The op amp used for the integrator stage 326 has an input resistor 344, an input capacitor 346, and a feedback capacitor 348, which together dominantly contribute to the open loop gain and frequency response of the feedback amplifier. The inverter stage 324 has input and feedback resistors 340 and 342 for achieving the desired inversion for establishing the proper feedback polarity and providing additional open loop gain. Alternatively, the inverter stage can be omitted, provided that the inputs to the input stage 322 are reversed to maintain the proper sense of the feedback.

The attenuator of FIG. 3 is preferably implemented with a pair of resistors 328 and 330. The ratio of these resistors sets the gain of the feedback amplifier ("G" from the above equations), where the ratio of resistor 328 to resistor 330 equals G–1.

The integrator stage 326 improves the accuracy of the measurement circuit. As is known, integrators have extremely high gain at DC. Therefore, the output of the input stage 322 need only move by minute amounts to establish any desired output voltage of the feedback amplifier as a whole. This is important because the input stage 322 has finite open loop gain, i.e., it can only change its output voltage by experiencing a change in voltage between its non-inverting and inverting inputs. During closed loop operation, changes in output voltage thus effectively cause the circuit to suffer from an output-dependent offset error, which is reflected in the measurement result. The integrator stage 326 virtually eliminates this error by ensuring that the output of the input stage 322 never move by more than minute amounts.

Figure 4:
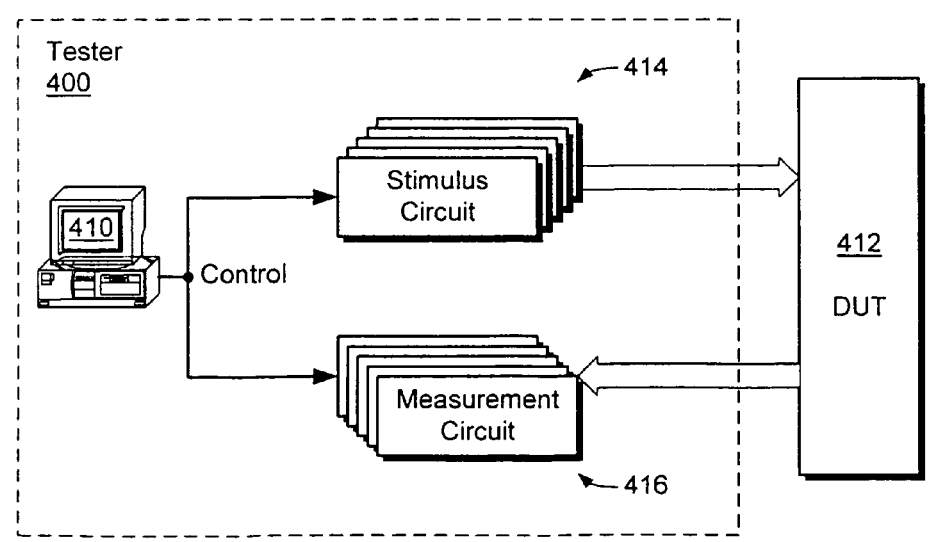
FIG. 4 is a high-level block diagram of a tester that includes measurement circuits according to the invention.

FIG. 4 shows a typical test environment in which the measurement circuit of FIGS. 2 and 3 may be used. This test environment includes an automatic test system 400 having a test computer 410 for running a test program (not shown). The test computer controls instrumentation, such as stimulus circuits 414 and measurement circuits 416, for exercising a device under test, or "DUT" 412. The measurement circuits include the measurement circuit disclosed herein and shown in FIGS. 2 and 3. Under control of the test program, the stimulus circuits 414 apply predetermined stimuli to the DUT 412, and the measurement circuits 416 measure voltages and/or currents as responses from the DUT 412. The test program compares the measured voltages and/or currents to expected values. If the readings are within allowable tolerances of the expected values, the test program passes. Otherwise, the test program fails.

The test environment of FIG. 4 is useful in a manufacturing environment, where electronic circuits such as integrated circuits are fabricated. To save manufacturing costs, devices are tested early in the manufacturing process, such as before they are packaged. Devices that pass the test program move on to subsequent manufacturing steps, whereas devices that fail may be discarded. Testing at this level prevents manufacturers from performing expensive fabrication steps on defective devices that are destined to be thrown away, and thus lowers overall manufacturing costs. In addition, the test program may be used to grade devices according to their performance. Devices meeting higher standards may be set aside and sold at higher prices than those performing to lower standards.

Alternatives

Having described one embodiment, numerous alternative embodiments or variations can be made. The measurement circuit shown in FIGS. 2 and 3 are configured to receive a differential input voltage having both a HI input and a LO input. Alternatively, the LO input can be grounded, making the input signal effectively single-ended. In this case, the adder 214/314 can be omitted, and the pedestal source can be coupled directly to the differential amplifier 210/310.

Nominally, the HI side of the input signal is more positive than the LO side, but nothing in the design of the measuring circuit requires this. The LO side can convey more positive voltages than the HI side, or vice-versa.

Although the measurement circuit shown in FIGS. 2 and 3 receives an input signal as a voltage (either differential or single-ended), nothing requires that the circuit be used for measuring only voltages from a device under test. The measurement circuit can also be used for measuring current, for example, by connecting a shunt resistor between HI and LO and measuring the voltage induced by current flowing across the shunt.

While the invention has been particularly shown and described with reference to the preferred embodiments thereof, it will be understood by those skilled in the art that various changes in form and detail may be made therein without departing from the spirit and scope of the invention.

What is claimed is:

1. A measurement circuit comprising:
    a differential amplifier having a first input and a second input;
    a feedback amplifier having a first input for receiving an input signal to be measured, a second input for receiving a feedback signal, and an output coupled to the second input of the differential amplifier; and
    an attenuator coupled between the first and second inputs of the differential amplifier and providing the feedback signal for the feedback amplifier.

2. A measurement circuit as recited in claim 1, wherein the input signal at the first input of the feedback amplifier is a HI side of a differential input signal, the measurement circuit further comprising:
    an adding circuit coupled in series with the pedestal source for adding a LO side of the differential input signal to the pedestal signal.

3. A measurement circuit as recited in claim 1, wherein the attenuator comprises:
    a first impedance having a first node coupled to the output of the feedback amplifier and a second node coupled to the second input of the feedback amplifier; and
    a second impedance having a first node coupled to the second input of the feedback amplifier and a second input coupled to the first input of the differential amplifier.

4. A measurement circuit as recited in claim 1, wherein the first and second impendances are resistors each having a resistance, and the resistance of the first impedance is at least 100 times greater than the resistance of the second impedance.

5. A measurement circuit as recited in claim 4, wherein the differential amplifier has a differential gain of less than 100.

6. A measurement circuit as recited in claim 1, wherein the pedestal source comprises a digital-to-analog converter.

7. A measurement circuit as recited in claim 1, wherein the feedback amplifier comprises a compensation amplifier for establishing desired dnamic charateristics of the feedback circuit.

8. A measurement circuit as recited in claim 7, wherein the compensation amplifier comprises an integrator.

9. A measurement circuit as recited in claim 1, wherein the feedback amplifier comprises:
    an input stage for receiving the input signal to be measured and the feedback signal; and a
    integrator stage, having an input coupled to the output of the input stage and an output coupled to the second input of the differential amplifier, for providing high gain at DC.

10. A measurement circuit as recited in claim 9, wherein the feedback amplifier further comprises an inverting stage coupled in series between the output of the input stage and the input of the inverter stage.

11. A measurement circuit as recited in claim 10, wherein each of the input stage, inverting stage, and integrator stage comprises at least one op amp.

12. An automatic test system for testing electronic devices, comprising:
    a computer for executing a test program,
    stimulus circuits operable under control of the computer; and
    measurement circuits operable under control of the computer, at least one of the measurement circuit comprising:
        a differential amplifier having a first input and a second input;
        a feedback amplifier having a first input for receiving an input signal to be measured, a second input for receiving a feedback signal, and an output coupled to the second input of the differential amplifier; and
        an attenuator having first and second nodes coupled respectively to the first and second inputs of the differential amplifier, and a third node for providing the feedback signal for the feedback amplifier.

13. An automatic test system as recited in claim 12, wherein the input signal at the first input of the feedback amplifier is a HI side of a differential input signal, the measurement circuit further comprising;
    an adding circuit coupled in series with the pedestal source for adding a LO side of the differential input signal to the pedestal signal.

14. An automatic test system as recited in claim 12, wherein the attenuator comprises:
    a first impedance having a first node coupled to the output of the feedback amplifier and a second node coupled to the second input of the feedback amplifier; and
    a second impedance having a first node coupled to the second input of the feedback amplifier and a second input coupled to the first input of the differential amplifier.

15. An automatic test system as recited in claim 12, wherein the first and second impedances are resistors each having a resistance, and the resistance of the first impedance is at least 100 times greater than the resistance of the second impedance.

16. An automatic test system as recited in claim 15, wherein the differential amplifier has a differential gain of less than 100.

* * * * *